(12) United States Patent
Su

(10) Patent No.: US 6,639,791 B2
(45) Date of Patent: Oct. 28, 2003

(54) PORTABLE EXTERNAL HARD DRIVE

(75) Inventor: Hwa Su, Taipei (TW)

(73) Assignee: Hung-Ping Hsu, Taipei (TW)

( * ) Notice: Subject to any disclaimer, the term of this patent is extended or adjusted under 35 U.S.C. 154(b) by 56 days.

(21) Appl. No.: 10/042,155

(22) Filed: Jan. 11, 2002

(65) Prior Publication Data
US 2003/0099090 A1 May 29, 2003

(30) Foreign Application Priority Data
Nov. 29, 2001 (CN) ........................... 01 2 75103 U

(51) Int. Cl.⁷ ................................................. G06F 1/16
(52) U.S. Cl. ..................... 361/685; 361/704; 360/98.01; 312/223.2

(58) Field of Search ......................... 361/728, 724–727, 361/683–687, 704, 707; 360/97.01, 98.01; 364/708.1; 312/223.1–223.6; D14/433

(56) References Cited

U.S. PATENT DOCUMENTS

D462,689 S  * 9/2002 Moran ...................... D14/433
6,522,534 B1 * 2/2003 Wu .............................. 361/686
2003/0016491 A1 * 1/2003 Frame et al. ................ 361/683

* cited by examiner

Primary Examiner—Darren Schuberg
Assistant Examiner—Hung Van Duong
(74) Attorney, Agent, or Firm—Bacon & Thomas, PLLC

(57) ABSTRACT

A portable external hard drive has a body, a memory detachably connected to the circuit board of the body and a cap detachably engaged with the body to enclose the connecting end of the circuit board of the body. A stand is provided to support the portable external hard drive.

12 Claims, 7 Drawing Sheets

PORTABLE EXTERNAL HARD DRIVE

BACKGROUND OF THE INVENTION

1. Field of the Invention

The present invention relates to a portable external hard drive, and more particularly to an external hard drive enabling the user to quickly attach to and detach from the host of a computer.

2. Description of Related Art

Due to the large memory requirements from the market, different kinds of memories are invented to meet the need. However, memories with large storage space normally weigh a lot, which inevitably increases the weight of the computer. In order to overcome the drawback, a portable external hard drive is invented to the market to work with the hard drive built in the computer, which dramatically increases the convenience to the user. Yet, with reference to FIG. 1, a conventional portable external hard drive is shown and has a casing A with a USB (universal series bus) transmission interface (not shown). A USB connector B extends out from one end of the casing A. A cap C is provided to connect to the casing A to cover the extended USB connector B. With such an arrangement, the user is able to read and write information to and from the computer by means of the USB transmission interface.

Although the foregoing portable external hard drive does bring convenience to the user, the portable external hard drive of this type still suffers a drawback.

The memory capacity of this type is fixed and can not be changed. The user will have to buy different types of memories to cope with various needs, which not only looses the essence of portability, but also increases cost to the user.

To overcome the shortcomings, the present invention intends to provide an improved external hard drive to mitigate or obviate the aforementioned problems.

SUMMARY OF THE INVENTION

The primary objective of the invention is to provide a portable external hard drive having a memory module detachably connected to the body of the hard drive so that the user is able to replace the memory module when necessary.

Another objective of the invention is to provide a stand for the portable external hard drive so that the external hard drive is able to be supported by the stand for easy access.

Other objects, advantages and novel features of the invention will become more apparent from the following detailed description when taken in conjunction with the accompanying drawings.

DETAILED DESCRIPTION OF PREFERRED EMBODIMENT

Figure 1:
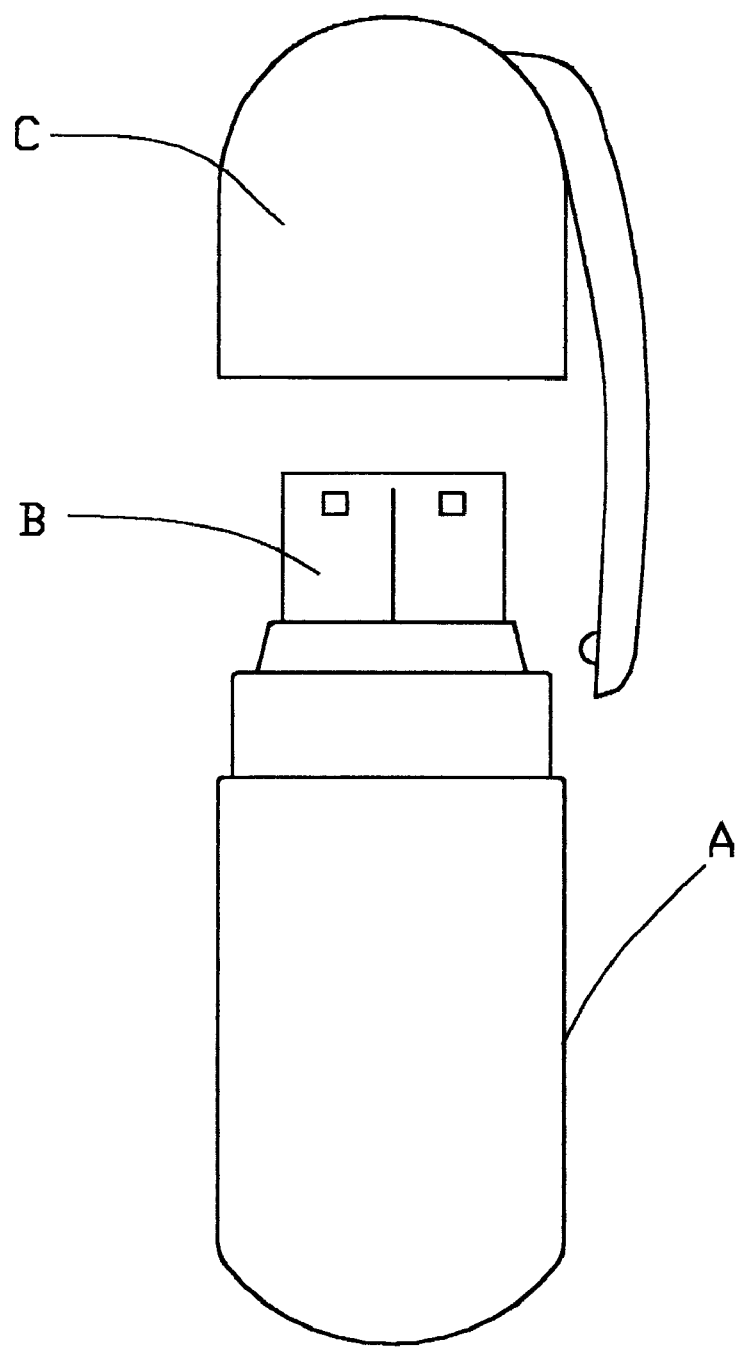
FIG. 1 is an exploded plan view of a conventional external hard drive.
Figure 2:
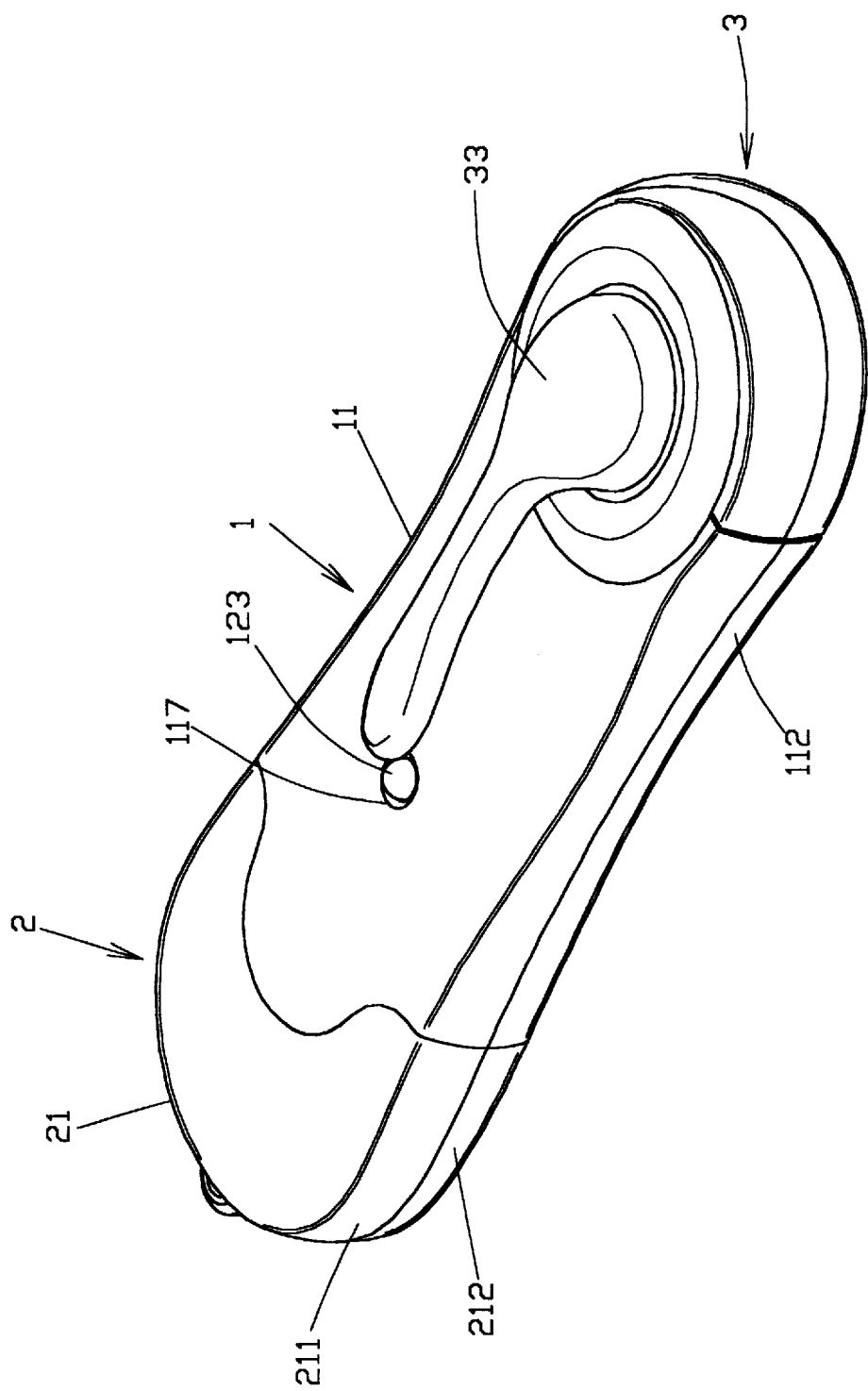
FIG. 2 is a perspective view of the portable external hard drive of the present invention.
Figure 3:
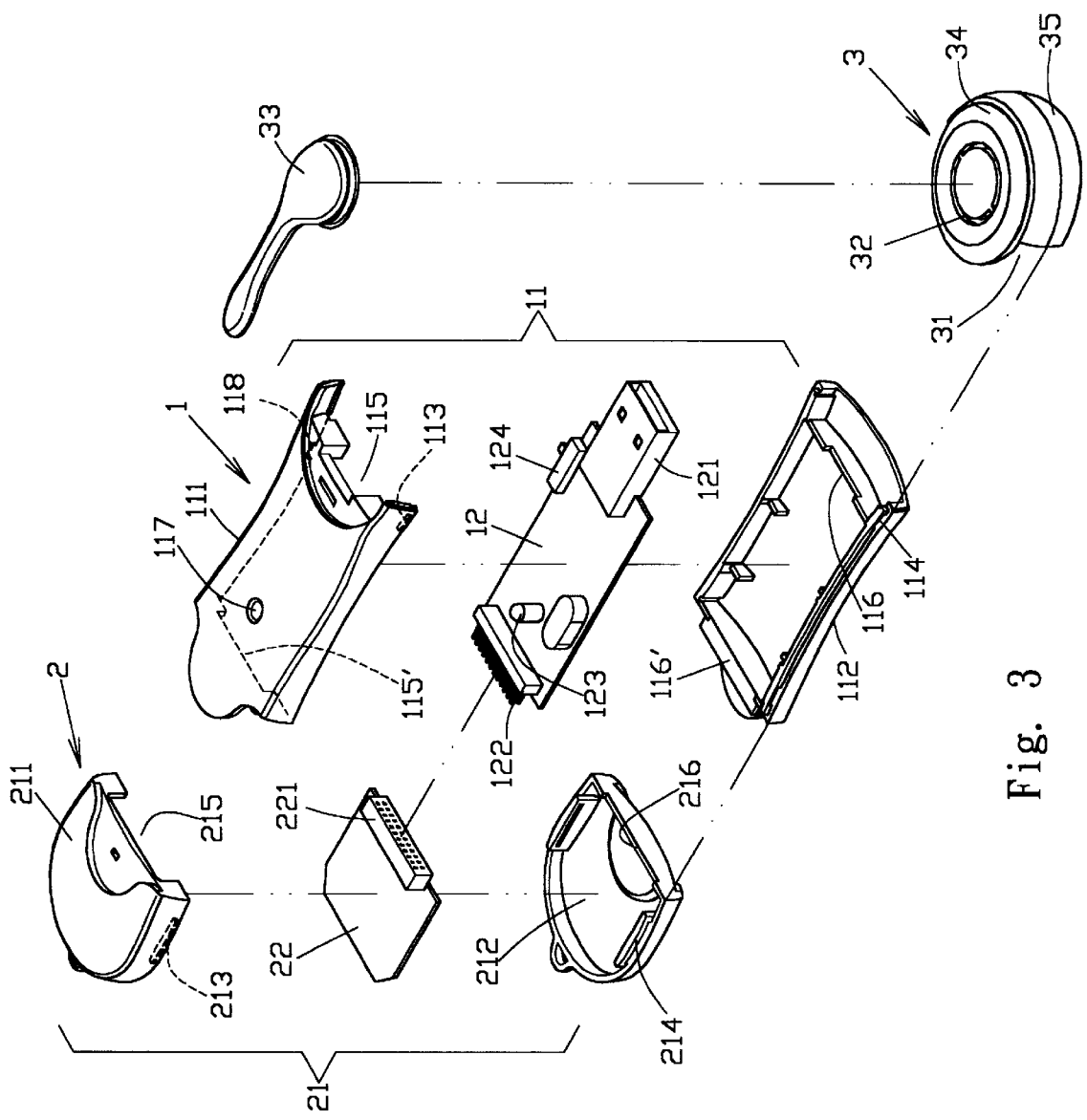
FIG. 3 is an exploded perspective view of the portable external hard drive in FIG. 1.

With reference to FIGS. 2 and 3, the portable external hard drive in accordance with the present invention has a body 1, a memory module 2 and a cap 3.

The body 1 has a casing 111 and a circuit board 12 received in the casing 11 and having a connecting end 121 formed on one end of the circuit board 12 and extending out of the casing 11 to be connected to the computer (not shown). The connecting end 121 may be a USB connector. On the other end of the circuit board 12, an engaging end 122 is formed. The engaging end 122 may be a connector with multiple pins. The casing. 11 is composed of an upper casing 111 and a lower casing 112. The upper casing 111 has protrusions 113 defined in an inner face of opposite side faces of the upper casing 111 to correspond to recesses 114 defined in the lower casing 112 so that the upper casing 111 is able to engage with the lower casing 112 by means of the protrusions 113 being snap fitted in the corresponding recesses 114. The upper casing 111 further has a first upper cutout 115 in one distal end of the upper casing 111 and a second upper cutout 115' in the other distal end of the upper casing 111. The lower casing 112 has a first lower cutout 116 in one distal end of the lower casing 112 to correspond to the first upper cutout 115 and a second lower cutout 116' in the other distal end of the lower casing 112 to correspond to the second upper cutout 115'. With the mutual corresponding relationship between the first and second upper cutouts 115,115' and the first and second lower cutouts 116,116', the upper and lower casings 111,112 defme a first opening (not numbered) and a second opening (not numbered) to respectively receive the connecting end 121 and the engaging end 122. The circuit board 12 further has an indicator 123 and a switch 124 on a side of the circuit board 12. In order to cope with the indicator 123 and the switch 124, the casing 11 has a hole 117 corresponding to the indicator 123 and a notch 118 corresponding to the switch 124 so that after the circuit board 12 is received in the casing 11, the indicator 123 and the switch 124 protrude out of the casing 11.

The memory module 2 has a casing 21 and a circuit board 22. The casing 2 includes an upper casing 211 and a lower casing 212. The upper casing 211 has protrusions 213 defined in an inner face of opposite side faces of the upper casing 211 to correspond to recesses 214 defined in the lower casing 212 so that the upper casing 211 is able to engage with the lower casing 212 by means of the protrusions 213 being snap fitted in the corresponding recesses 214. The upper casing 211 further has a first upper cutout 215 in one distal end of the upper casing 211. The lower casing 212 has a first lower cutout 216 in one distal end of the lower casing 212 to correspond to the first upper cutout 215. With the mutual corresponding relationship between the first upper and lower cutouts 215,216, the upper and lower casings 211,212 define an opening (not numbered) to receive the socket end 221 of the circuit board 22.

The cap 3 of the present invention has an indentation 31 defined to be connected to the casing 11 so as to mate the first opening in the casing 11. That is, the cap 3 is detachably connected to the casing 11 and when the cap 3 connects to the casing 11, the cap 3 encloses the connecting end 121 of the circuit board 12. The cap 3 has an upper part 34 and a lower part 35 securely mounted with the upper part 34. The upper part further has a connecting part 32 for engaging with a clip 33. That is, the clip 33 is securely engaged with the connecting part of the upper part 34. With the clip 33, the user is able to carry the body 1.

It is noted from the foregoing description that the memory module 2 is able to detachably connected to the circuit board 12 by means of the socket end 221 and the engaging end 122. When the user wants to change the memory module 2, the user just pulls the memory module 2 out from the casing 11 to detach the connection between the socket end 221 of the memory module 2 and the engaging end 122 of the circuit board 12 of the casing 11.

Figure 4:
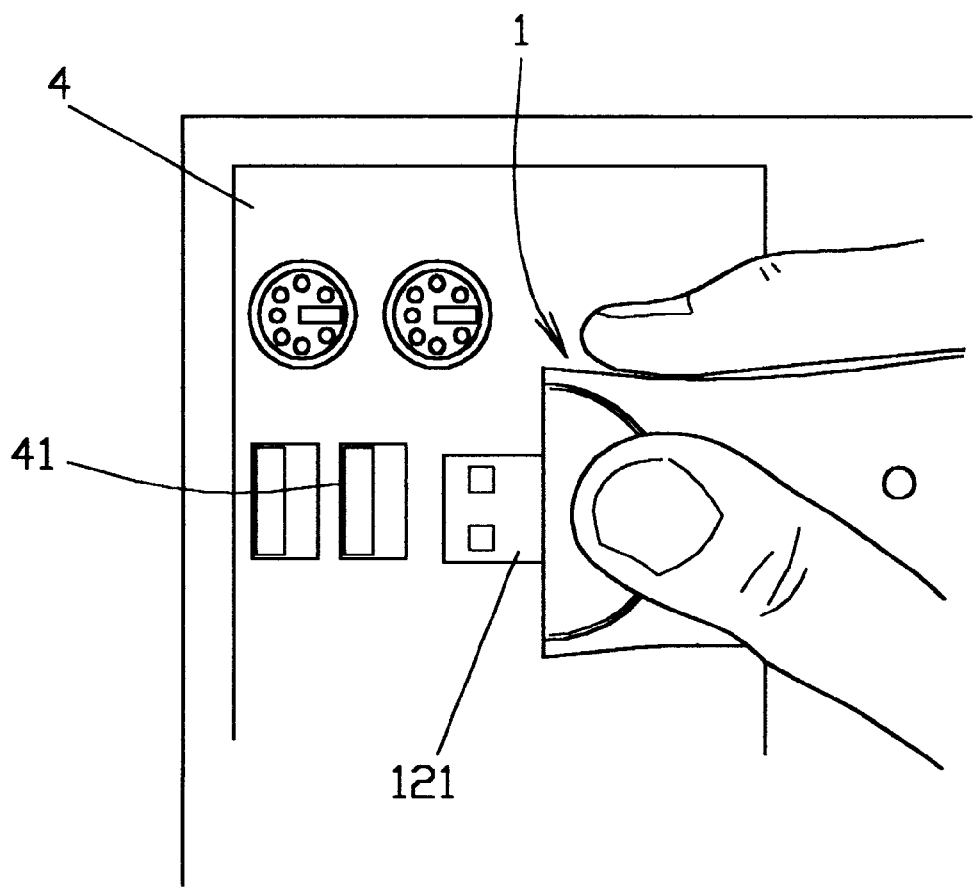
FIG. 4 is a schematic view showing the application of the external hard drive with the cap removed.
Figure 5:
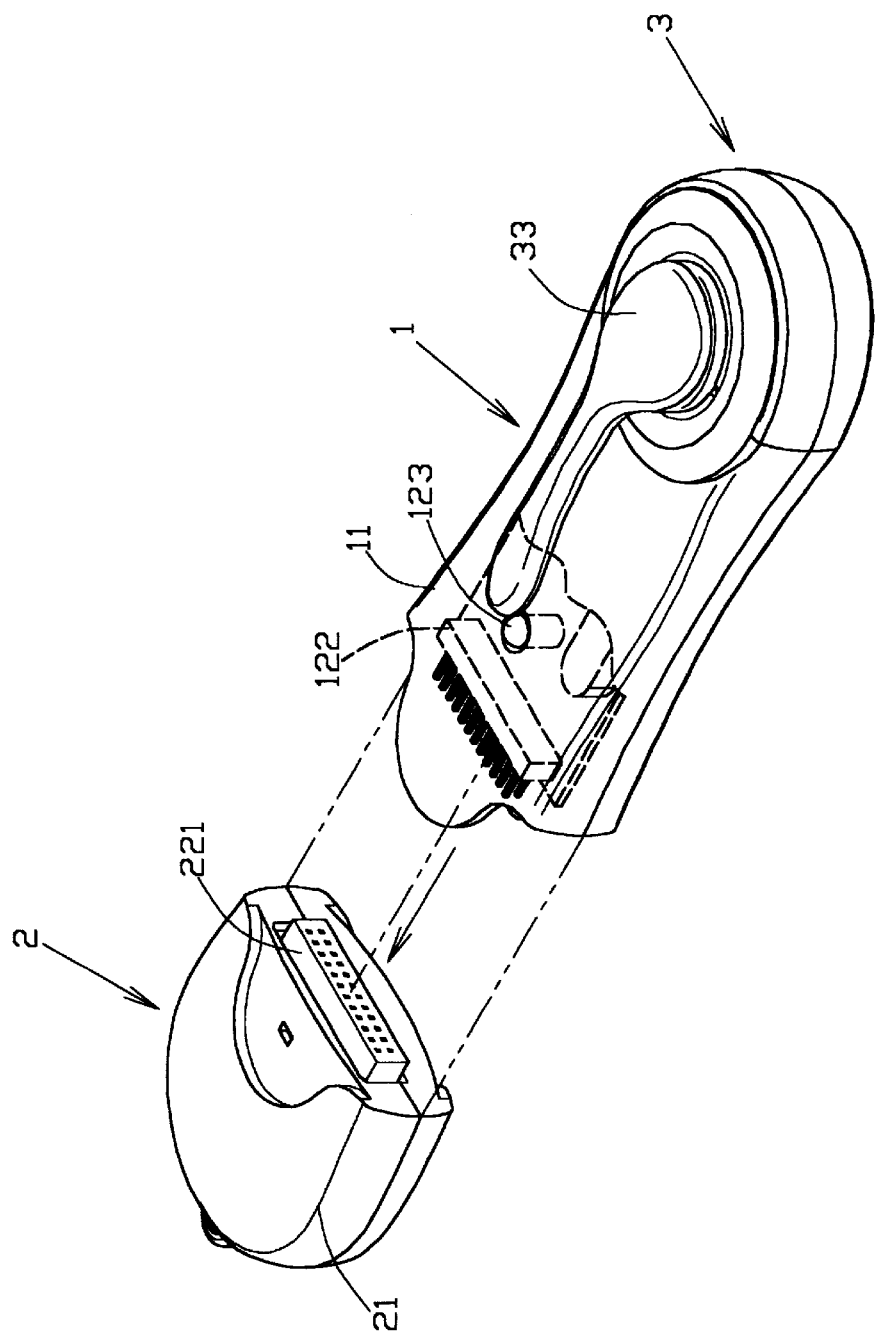
FIG. 5 is an operational view showing how the memory module is replaced.

With reference to FIGS. 4 and 5, because the USB connector (the connecting end 121 of the circuit board 12) is conventional in the art, detailed description thereof is thus omitted hereinafter.

When the user uses the present invention, the user removes the cap 3 to expose the connecting end 121 to connect to the USB socket 41 of the computer 4, thus the user is able to read and write information from and to the computer 4. When the user wants to change the memory module 2, the user removes the memory module 2 to detach the socket end 221 and the engaging end 122. Then the user is able to replace the required memory module 2. With such a procedure, the user is able to expand the memory capacity from 8 MB to 256 MB, which is very convenient to the user.

Figure 6:
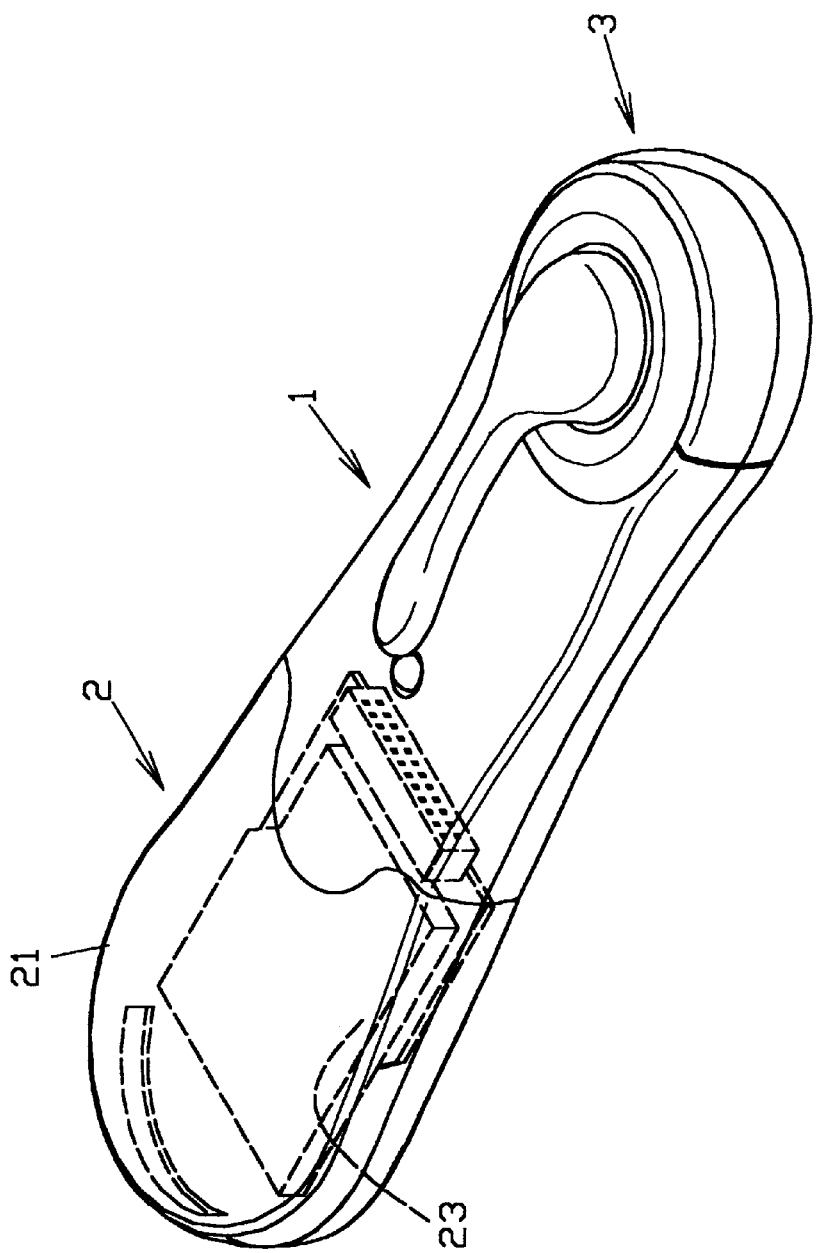
FIG. 6 is a perspective view of another embodiment of the external hard drive of the present invention.

With reference to FIG. 6, it is noted that the circuit board 22 of the memory module 2 may be a SD, MMC or a MS card 23 with only a single-port.

Figure 7:
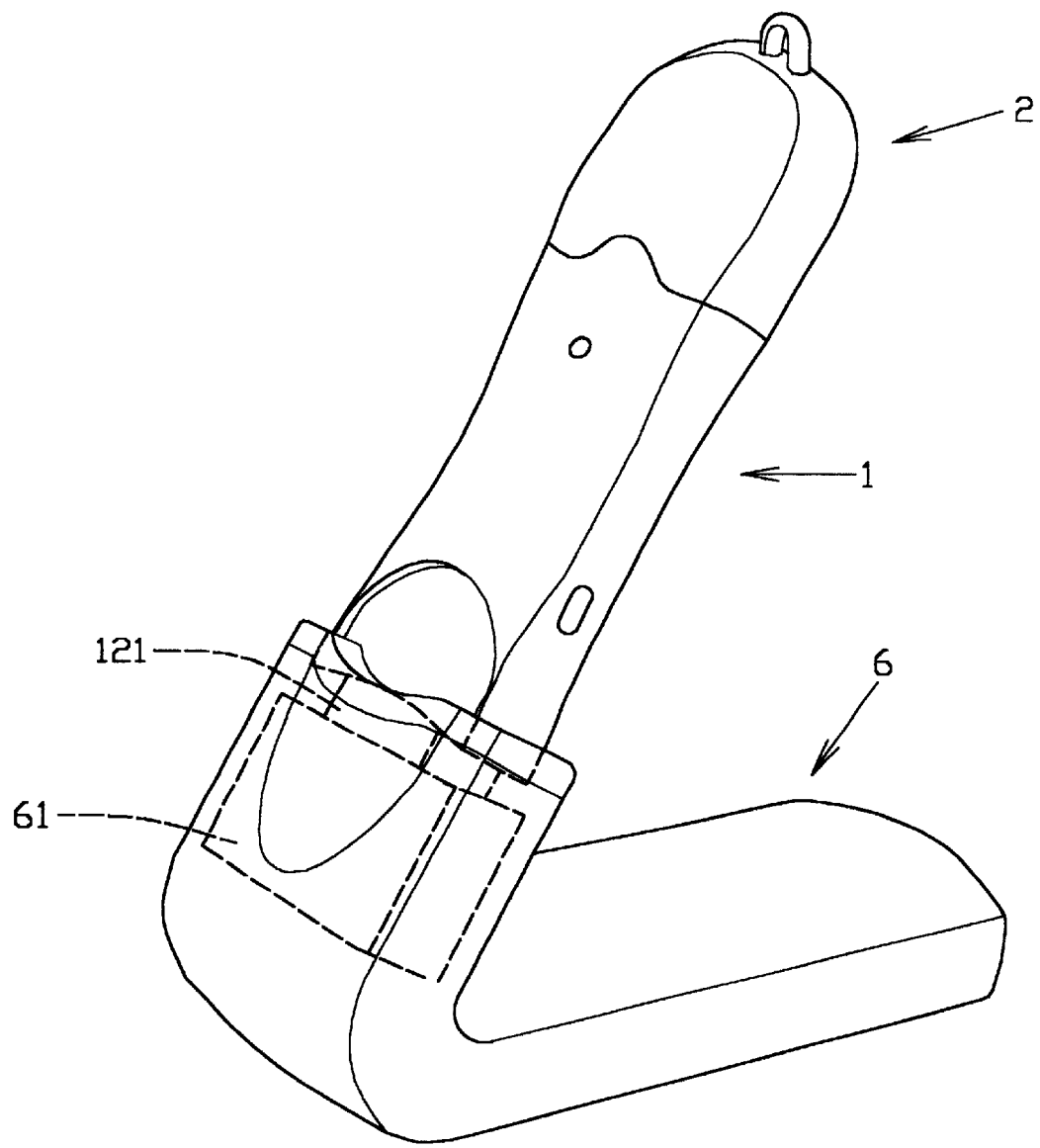
FIG. 7 is a perspective view showing the external hard drive is supported by a stand in accordance with the present invention.

With reference to FIG. 7, a stand 6 with a receiving hole 61 is provided so that the external hard drive of the present invention is able to be inserted in the stand 6 and thus supported by the stand 6, which enables the user to place the external hard drive on the table for easy access.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A portable external hard drive comprising:
  a body having a casing and a circuit board received in the casing and having a connecting end formed on one end of the circuit board and extending out of the casing to be adapted to connect to a computer and an engaging end formed on the other end of the circuit board;
  a memory module having a casing and a circuit board, wherein the casing includes an upper casing and a lower casing, the upper casing has protrusions defined in an inner face of opposite side faces of the upper casing to correspond to recesses defined in the lower casing so that the upper casing is able to engage with the lower casing by means of the protrusions being snap fitted in the corresponding recesses, wherein the upper casing further has a first upper cutout in one distal end of the upper casing and the lower casing has a first lower cutout in one distal end of the lower casing to correspond to the first upper cutout so that the upper and lower casings of the memory module define an opening to receive the socket end of the circuit board of the body; and
  a cap having an indentation defined to be connected to the casing of the body so as to detachably connect to the casing of the body to enclose the connecting end of the circuit board of the body, wherein the cap has an upper part and a lower part securely mounted with the upper part, the upper part further has a connecting part for securely engaging with a clip.

2. The portable external hard drive as claimed in claim 1, wherein the casing of the body is composed of an upper casing and a lower casing, the upper casing has protrusions defined in an inner face of opposite side faces of the upper casing to correspond to recesses defined in the lower casing so that the upper casing is able to engage with the lower casing by means of the protrusions being snap fitted in the corresponding recesses, wherein the upper casing further has a first upper cutout in one distal end of the upper casing and a second upper cutout in the other distal end of the upper casing, the lower casing has a first lower cutout in one distal end of the lower casing to correspond to the first upper cutout and a second lower cutout in the other distal end of the lower casing to correspond to the second upper cutout so that the upper and lower casings define a first opening and a second opening to respectively receive the connecting end and the engaging end.

3. The portable external hard drive as claimed in claim 1 further has a stand with a receiving hole defined to receive and support the portable external hard drive therein.

4. The portable external hard drive as claimed in claim 2, wherein the connecting end is a USB connector.

5. The portable external hard drive as claimed in claim 2, wherein the circuit board of the body further has an indicator and a switch on a side of the circuit board.

6. The portable external hard drive as claimed in claim 2 further has a stand with a receiving hole defined to receive and support the portable external hard drive therein.

7. The portable external hard drive as claimed in claim 2, wherein engaging end is a connector with multiple pins.

8. The portable external hard drive as claimed in claim 4 further has a stand with a receiving hole defined to receive and support the portable external hard drive therein.

9. The portable external hard drive as claimed in claim 5, wherein the casing of the body has a hole corresponding to the indicator and a notch corresponding to the switch so that after the circuit board is received in the casing, the indicator and the switch protrude out of the casing of the body.

10. The portable external hard drive as claimed in claim 5 has a stand with a receiving hole defined to receive and support the portable external hard drive therein.

11. The portable external hard drive as claimed in claim 7 further has a stand with a receiving hole defined to receive and support the portable external hard drive therein.

12. The portable external hard drive as claimed in claim 9 further has a stand with a receiving hole defined to receive and support the portable external hard drive therein.

* * * * *